United States Patent
Yamaguchi

(10) Patent No.: US 7,453,275 B2
(45) Date of Patent: Nov. 18, 2008

(54) PROBE CARD

(75) Inventor: Tomoharu Yamaguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/798,809

(22) Filed: May 17, 2007

(65) Prior Publication Data
US 2007/0268035 A1    Nov. 22, 2007

(30) Foreign Application Priority Data
May 19, 2006    (JP) .............................. 2006-140431

(51) Int. Cl.
*G01R 31/02* (2006.01)
(52) U.S. Cl. .................. 324/754; 324/757; 324/761
(58) Field of Classification Search ................ 324/754, 324/761, 757
See application file for complete search history.

(56) References Cited

U.S. PATENT DOCUMENTS

| | | | |
|---|---|---|---|
| 5,623,213 A * | 4/1997 | Liu et al. ..................... | 324/754 |
| 6,566,149 B1 * | 5/2003 | Kanamaru et al. ............ | 438/14 |
| 6,870,385 B2 * | 3/2005 | Inoue et al. .................. | 324/765 |
| 2003/0176066 A1 | 9/2003 | Zhou et al. | |
| 2007/0182430 A1 * | 8/2007 | Ismail et al. ................. | 324/754 |

FOREIGN PATENT DOCUMENTS

| EP | 1 640 730 A1 | 3/2006 |
|---|---|---|
| JP | 2001-141771 | 5/2001 |
| JP | 2006-098064 A | 4/2006 |

* cited by examiner

*Primary Examiner*—Ha Nguyen
*Assistant Examiner*—Karen M Kusumakar
(74) *Attorney, Agent, or Firm*—Foley & Lardner LLP

(57) ABSTRACT

The board of a probe card of the present invention comprises a first substrate having a first inclined surface at the side surfaces and a second substrate having a second inclined surface. The first substrate and the second substrate are disposed such that the first inclined surface and the second inclined surface are opposed to each other. Between the first inclined surface and the second inclined surface, a stress absorber having electroconductivity is sandwiched.

18 Claims, 4 Drawing Sheets

PROBE CARD

BACKGROUND OF THE INVENTION

1. Field of the Invention

The present invention relates to a probe card used for measurement of electrical properties of a semiconductor integrated circuit element and the like.

2. Description of the Related Art

In general, in the step of manufacturing a semiconductor integrated circuit element and the like, there is a wafer test step for testing whether individual chips on a wafer are good or defective. In this wafer test, usually, first, a probe card is attached to a device called a prober. After bringing a probe of the probe card into contact with a predetermined pad (electrode) on the chip of the wafer, a given or more pressure is applied (referred to as overdrive action), thereby to perform the test.

In recent years, to shorten the test time, it has become an important challenge to increase the number of simultaneous measurements of the probe card. In the cantilever system card which is a conventional known art, condition that limit the number of needle pricking are strict, and the number of simultaneous measurements is limited. Hence, the research and development by adopting a vertical needle system probe card and a photolithography probe card has been prevailing (for example, Japanese Patent Application Laid-Open No. 2006-98064).

A side cross-sectional view of a conventional ordinary vertical needle system probe card is shown in FIG. 1.

A conventional vertical needle system probe card 100 comprises a substrate 110 having-through-holes 101 formed therein, a needle position support base 104 having guide holes 104a formed therein, and probes 102. Substrate 110 and needle position support base 104 are sandwiched by reinforcing plates 103a and 103b, and are fixed by bolt 106. Reinforcing plates 103a and 103b are for enhancing the rigidity of the substrate 110 against a needle load. Substrate 110 is prevented from bending upon receipt of the needle load through overdrive action by reinforcing plates 103a and 103b. The root of probe 102 is fixed at the upper part of through-hole 101 of substrate 110 by solder 105. Probe 102 is put into a bent state inside through-hole 101, and can absorb a pushing amount by overdrive action. Further, the interior of substrate 110 is provided with wiring for introducing electrical signals from an electrical testing device (tester), and the through-holes 101 are connected to this wiring.

Next, an electrical test (probing) by the probe card of the conventional embodiment will be described.

First, an unillustrated stage mounted with a semiconductor circuit element 200 is raised, and the top end portion of the probes 102 and pads 201 of the semiconductor circuit element 200 are brought into contact. Then, overdrive action is applied to the stage in the contact direction to break an oxide film on the pad surface, the stage is applied with overdrive action toward the contact direction. Electrical signals from the electrical testing device (tester) are transferred to the pads 201 of semiconductor circuit element 200 through the wiring, through-holes 9 and probes 102 inside substrate 110, so that the electrical test of the semiconductor circuit element 200 is conducted. After that, the stage comes down, and performs a step and repeat up to the position of a semiconductor circuit element 200 in which the next test is performed, and is raised again to perform the test of the next semiconductor element 200. By repeating these operations, it can be determined whether all semiconductor circuit elements 200 are working properly.

However, when the substrate of the probe card is bent by the needle load when performing the electrical test (probing) due to the increase of the number of needles to be pricked accompanied with an increase of the number of simultaneous measurements, a reliable electrical test result cannot be obtained. Hence, heretofore, in spite of the fact that the rigidity of the substrate is enhanced by the reinforcing plates, more reliability needs to be secured.

SUMMARY OF THE INVENTION

In view of the above described problem, an object of the present invention is to prevent the bending of a substrate by a needle load and to provide a probe card in which the reliability of an electrical test result is enhanced.

To achieve the object, a probe card is provided that comprises a substrate having through-holes formed therein, into which probes are to be inserted, and probes extend from the through-holes are abutted on a measurement object so as to measure a variety of electrical properties of the measurement object, wherein the board comprises a first substrate having a first inclined surface at the side surface and a second substrate having a second inclined surface, wherein the first substrate and the second substrate are disposed such that the first inclined surface and the second inclined surface are opposed to each other, and the first substrate and the second substrate sandwich an electroconductive elastic member between the first inclined surface and the second inclined surface.

The substrate of the probe card of the present invention as described above comprises the first substrate and the second substrate, and these substrates sandwich the elastic member between the first inclined surface and the second inclined surface. Thus, through such a configuration, the needle load generated by overdrive action can be released laterally at the inclined surfaces, and at the same time, can be absorbed and dispersed through deformation of the elastic member. In other words, through the elastic member, the present invention can prevent the bending of the first substrate by dispersing and absorbing the needle load that bends the first substrate.

Further, the probe card of the present invention may comprise a member sandwiching and fixing the first substrate and the second substrate, which is arranged to abut on both main surfaces of the second substrate, and to abut on a first main surface of the first substrate to which the probe extends, and to have a gap formed with a second main surface therebetween which is a surface opposite to the first main surface.

Further, the probe of the probe card of the present invention may comprise a fixing portion having a tapered surface formed thereon and tapering off, wherein the first substrate has through-holes which narrow toward the insertion direction of the probes and through-holes have tapered shape having the same angle of inclination as the tapered surface of the fixing portion. In this case, because the fixing surface of the probe is tapered so that the fixing area is expanded, needle pressure applied to the fixing portion of the probe can be dispersed, and as a result, a stable fixing of the probe can be realized. Further, since the mutual contact area between the probe and the through-hole can be made wide, the contact resistance value is stabilized and, at the same time, electroconductivity is improved. Hence, the reliability of the electronic test result is enhanced.

According to the present invention, the needle load can be absorbed and dispersed by the substrate comprising the first substrate and the second substrate sandwiching the elastic member between the inclined surfaces. As a result, the bending of the first substrate can be prevented, and all the probes can be pushed uniformly against each of pads. Hence, the most appropriate amount of overdrive can be easily determined, and the reliability of the electronic test result can be enhanced.

The above and other objects, features, and advantages of the present invention will become apparent from the following description with reference to the accompanying drawings, which illustrate examples of the present invention.

DETAILED DESCRIPTION OF THE PREFERRED EMBODIMENT

The present invention will be described below with reference to the drawings.

Figure 1:
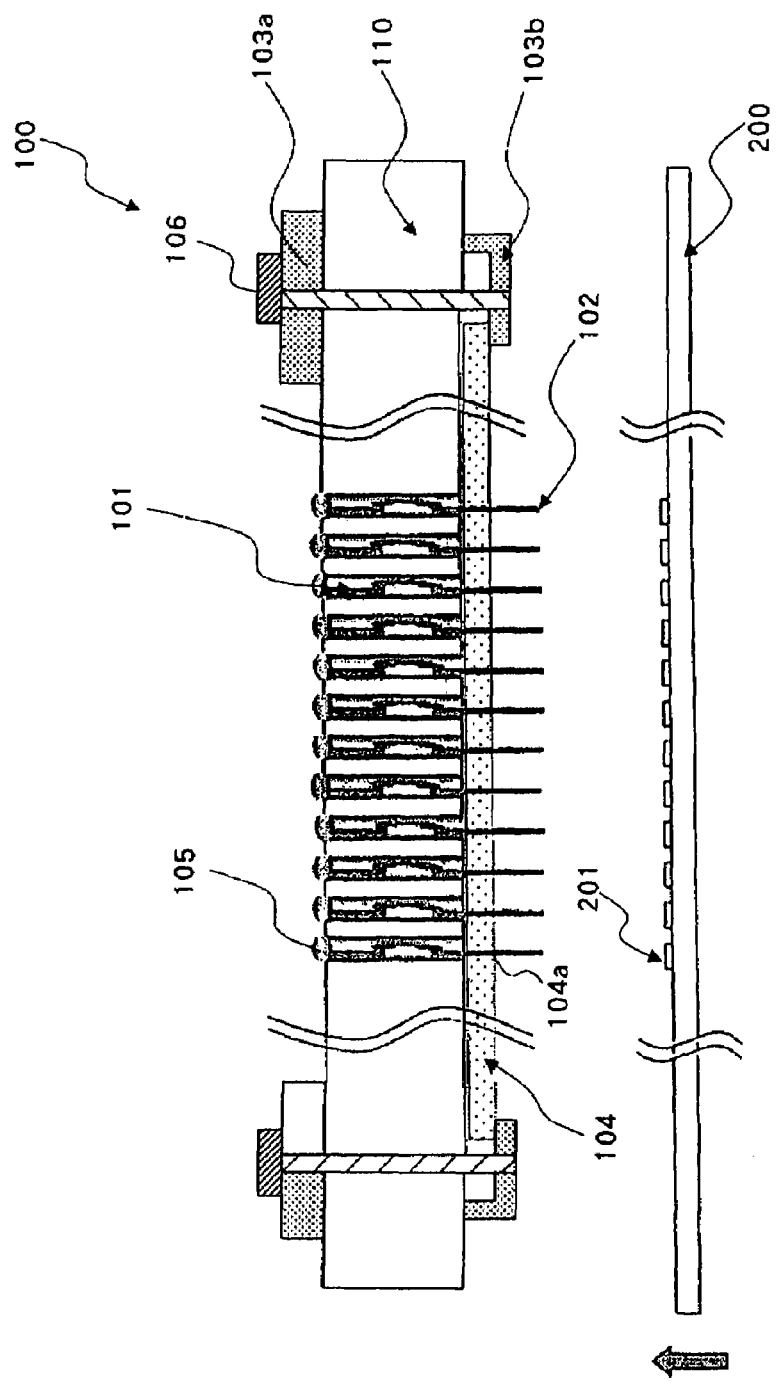
FIG. 1 is a side cross-sectional view of a conventional ordinary vertical needle system probe card.
Figure 2:
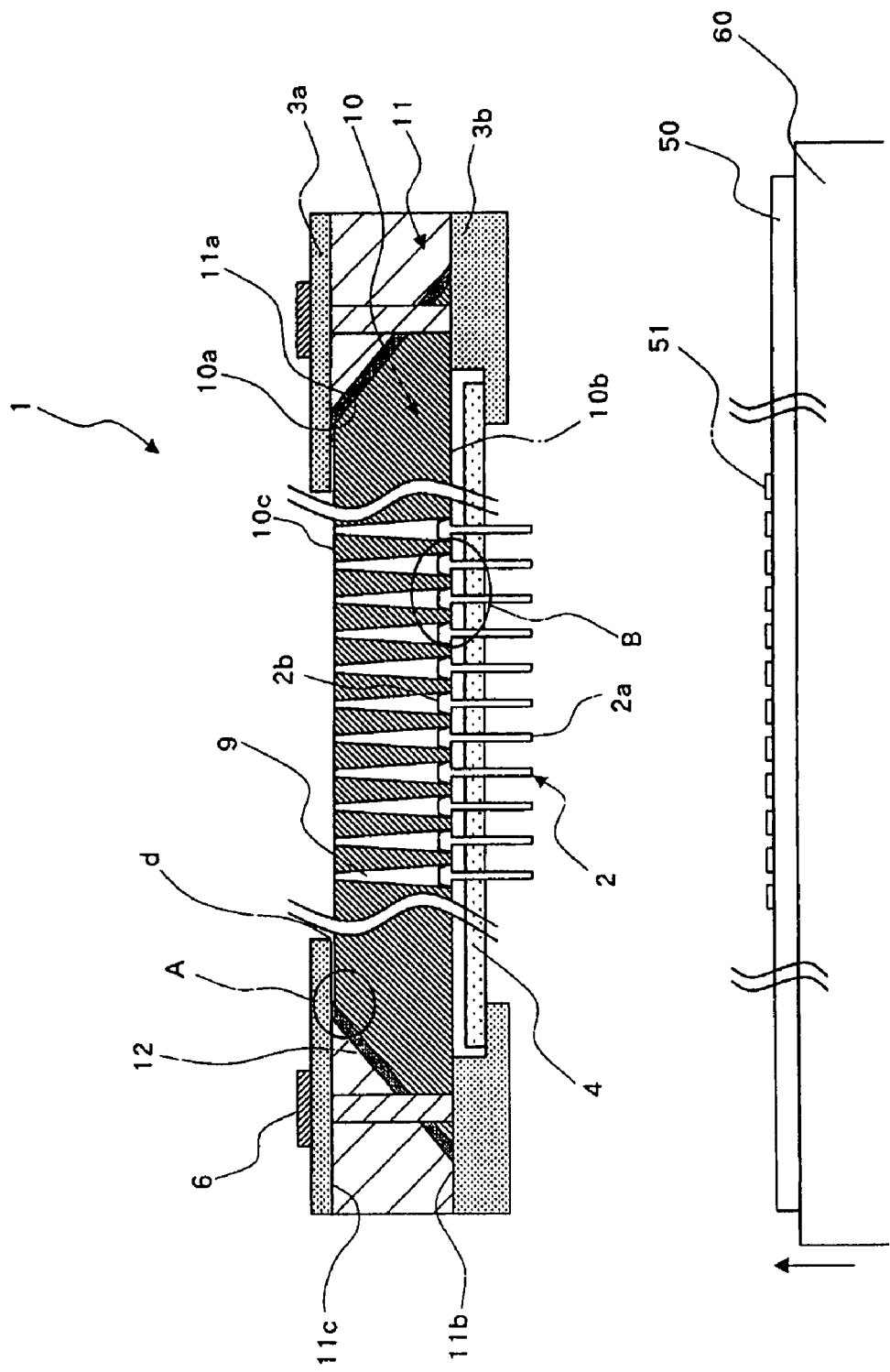
FIG. 2 is a cross-sectional view of one example of a probe card of an embodiment of the present invention.

In FIG. 2 is shown a cross sectional view of one example of a prove card of an embodiment of the present invention.

Figure 3:
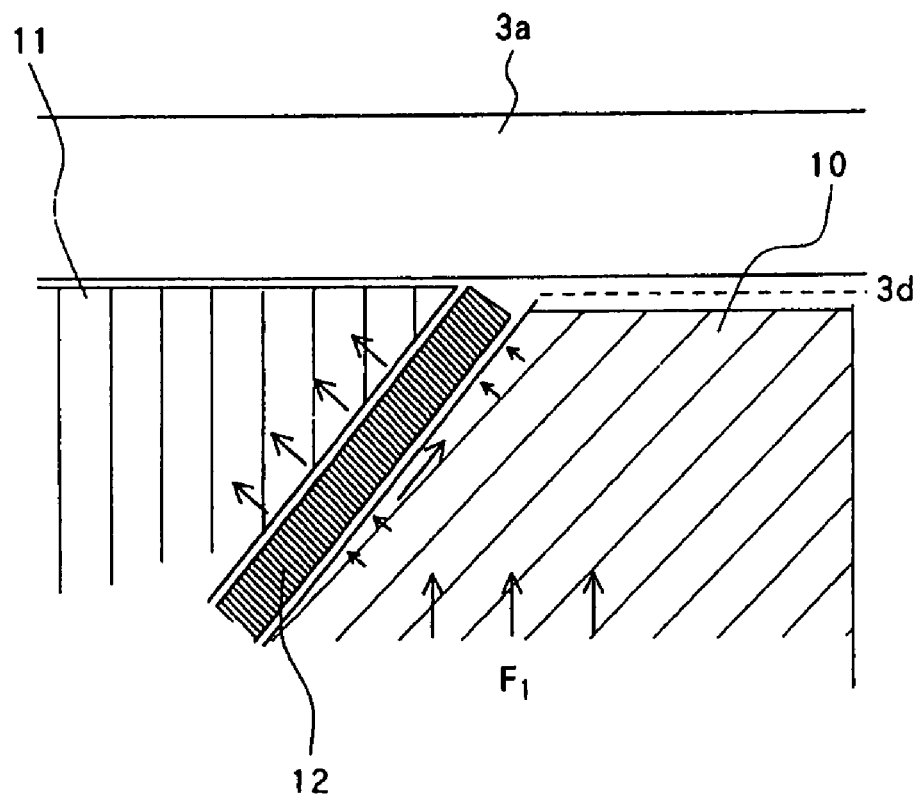
FIG. 3 is an enlarged view of an A portion in FIG. 2.
Figure 4:
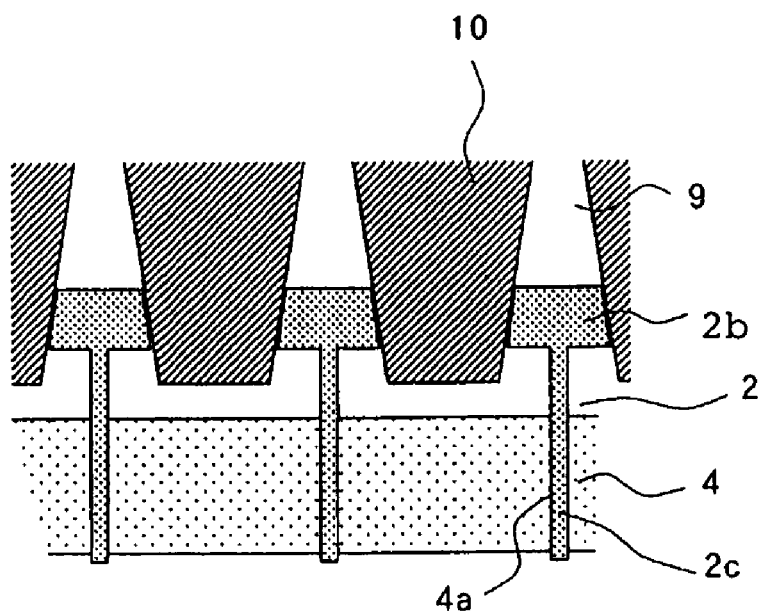
FIG. 4 is an enlarged view of a B portion in FIG. 2.
Figure 5:
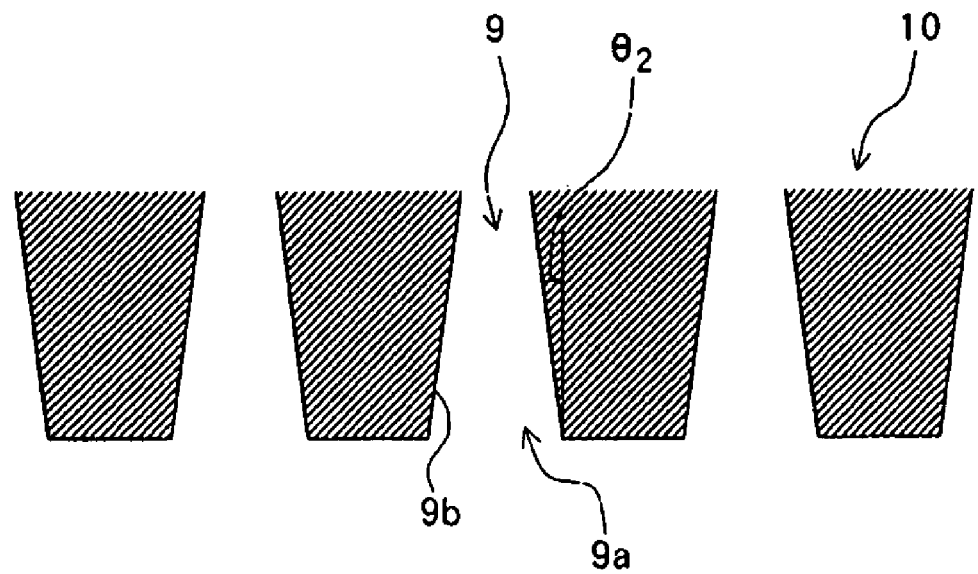
FIG. 5 is an explanatory drawing to explain a probe and a through-hole.
Figure 5:
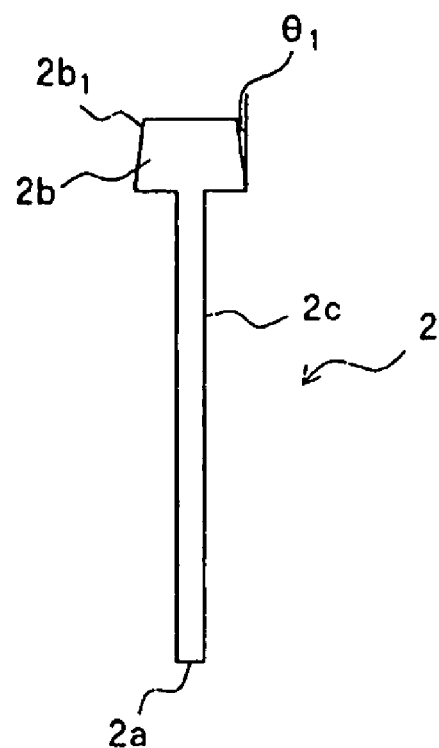

FIG. 3 is an enlarged view of an A portion in FIG. 2, and FIG. 4 is an enlarged view of a B portion in FIG. 2. FIG. 5 is an explanatory drawing to explain a probe and through-holes.

Probe card 1 comprises first substrate 10, second substrate 11, stress absorber 12 having electroconductivity, needle support base 4, reinforcing plates 3a and 3b, and probes 2.

A cross-sectional shape of first substrate 10 has inclined surface 10a formed at the side surface, and is in the shape of a trapezoid whose undersurface 10b (a first main surface) is larger compared with the upper surface 10c (a second main surface). Further, first substrate 10 has a plurality of tapered through-holes 9 formed therein that narrow undersurface 10b side towards upper surface 10c side. The interior of first substrate 10 is provided with wiring for introducing electrical signals from an electrical testing device (tester, not illustrated), and through-holes 9 are connected to this wiring.

Second substrate 11 also comprises inclined surface 11a having the same angle of inclination as inclined surface 10a of first substrate 10 at the side surface, and is in the shape of a trapezoid whose undersurface 11b is smaller compared with the upper surface 11c. Second substrate 11 is formed such that thicker than first substrate 10. Second substrate 11 is disposed such that inclined surface 11a is face to face with inclined surface 10a of first substrate 10. That is, first substrate 10 and second substrate 11 are disposed facing to each other so that inclined surface 10a and inclined surface 11a are parallel. Second substrate 11 is also provided with wiring for introducing electrical signals from the electrical testing device.

Stress absorber 12 is an elastic member having electroconductivity and sandwiched between inclined surface 10a and inclined surface 11a. An anisotropic electroconductive material is suitable as stress absorber 12 and for example, an anisotropic electroconductive sheet (manufactured by Shin-Etsu Polymer Co. Ltd) and an anisotropic electroconductive film (manufactured by Nitto Denko co. Ltd.) are may be used.

Needle support base 4 is gripped by reinforcing plate 3b at undersurface 10b side of first substrate 10. Needle support base 4 has guide holes 4a formed therein into which probe 2 are to be inserted, and guide holes guide axial portion 2c of the probes 2.

Reinforcing plates 3a and 3b sandwich first substrate 10 and second substrate 11 so as to be mutually fixed, and at the same time, enhance the rigidity against a needle load to be described later, thereby preventing first substrate 10 from being deformed. The fixing of first substrate 10 and second substrate 11 by reinforcing plates 3a and 3b are performed as follows.

Inclined surface 10a of the first substrate 10 and inclined surface 11a of second substrate 11 are positioned face to face, and stress absorber 12 is kept sandwiched between inclined surfaces 10a and 11a. In the example shown in FIG. 2, second substrates 11 are disposed respectively for inclined surfaces 10a formed at both side surfaces of first substrate 10. In this state, inclined surface 10a and inclined surface 11a are parallel to each other.

On reinforcing plate 3b, first substrate 10 and second substrate 11 are mounted. A peripheral portion (both end portions in FIG. 2) of undersurface 10b of first substrate 10 and the whole undersurface 11b of second substrate 11 abut on reinforcing plate 3b. Next, reinforcing-plate 3a is mounted on upper surface 11c of second substrate 11. Since the thickness of first substrate 10 is thinner as compared with the thickness of second substrate 11, between reinforcing plate 3a and upper surface 10c of first substrate 10, gap d is formed. In the present embodiment, to form gap d, though the thickness of first substrate 10 is made thinner as compared with the thickness of second substrate 11, the thickness of first substrate 10 and the thickness of second substrate 11 are made the same, and a part of reinforcing plate 3a corresponding to first substrate 10 may be made thin so as to form gap d.

Reinforcing plate 3a, first substrate 10, and second substrate 11 have a penetration hole formed therein to be penetrated through by bolt 6. Reinforcing plate 3b has a screw hole formed therein into which bolt 6 will be screwed. Between the penetration hole formed in first substrate 10 and bolt 6, a gap is formed. Bolt 6 is inserted into the penetration hole of reinforcing plate 3a, first substrate 10, and second substrate 11, and is screwed into the reinforcing plated 3b, so that first substrate 10 and second substrate 11 sandwich stress absorber 12 via inclined surfaces 10a and 11a, while being fixed by reinforcing plates 3a and 3b. Even when the substrates 10 and 11 are in a state fixed by reinforcing plates 3a and 3b, between reinforcing plate 3a and upper surface 10c of first substrate 10, gap d is secured. Gap d and a gap between the penetration hole of first substrate 10 and bolt 6 are secured for that purpose and when a needle load $F_1$, to be described later, is applied to first substrate 10, first substrate 10 can slide upward along inclined surface 10a.

Probe 2 comprises axis portion 2c, top end portion 2a, and fixing portion 2b. Top end portion 2a is one end of axis portion 2c for abutting on a pad of a semiconductor circuit element. Fixing portion 2b is formed in a tapered shape tapering off, and is another end of axis portion 2c.

An angle of inclination $\theta_1$ of the taper of fixing portion 2b is the same as an angle of inclination $\theta_2$ of the taper of through-hole 9. Probe 2 is fixed to first substrate 10 with fixing portion 2b side inserted into opening 9a side of through-hole 9. In other words, fixing portion 2b is deadlocked by a predetermined amount at a place where it has been inserted from opening 9a side of through-hole 9, and a tapered surface $2b_1$ of fixing portion 2b is adhered to tapered surface 9b of through-hole 9. Fixing portion 2b is adhered to and fixed with through-hole 9, thereby the position in the axial direction of probe 2 is determined in a state in which top end portion 2a and axis portion 2c extend from undersurface 10b of first substrate 10. Further, since fixing portion 2b and through-hole 9 are adhered mutually by the tapered surfaces, the contact area is wide, and therefore, needle pressure applied to fixing portion 2b can be dispersed. As a result, not only stable fixing of probe 2 can be realized, but also the contact resistance value is stabilized and, at the same time, electroconductivity is improved.

Although the present embodiment, though shows an example of fixing portion 2b being formed at the end portion of probe 2, the present invention is not limited to this example, and a fixing portion may be formed in the midst of axis portion 2c of probe 2. Further, in the present embodiment, although the diameter of fixing portion 2b has been illustrated larger than the diameter of axis portion 2c, the present invention is not limited to this, and fixing portion 2b may have a tapered shape tapering off from the same diameter as axis portion 2c.

Next, electrical test (probing) by probe card 1 of the present embodiment will be described.

First, stage 60 mounted with semiconductor circuit element 50 is raised, and top end portion 2a of probe 2 and pad 51 of semiconductor circuit element 50 are brought into contact. Next, to apply overdrive action in the contact direction by a predetermined overdrive amount, stage 60 is raised. Overdrive action means an operation to apply more than a certain amount of pressure in the contact direction to break an oxide film on the pad surface. Further, overdrive amount indicates a raised amount of having raised stage 60 mounted with semiconductor circuit element 50 from a reference point. The reference point is a contact point of the surface of pad 51 serving as an inspection object and top end portion 2a of probe 2.

After overdrive action, electrical signals from the electrical testing device are transferred to pad 51 of semiconductor circuit element 50 through the wiring of second substrate 11, stress absorber 12, wiring of first substrate 10, through-hole 9, and probe 2, thus performing the electrical test of semiconductor circuit element 50. After that, stage 60 comes down, and performs a step and repeat up to the position of a semiconductor circuit element 50 in which the next test is performed, and is raised again to perform the test of next semiconductor circuit element 50. By repeating these operations, stage 60 tests all the semiconductor circuit elements 50, and determines whether or not they are working well.

The needle pressure generated from overdrive action at the time of the electrical test becomes needle load (stress) $F_1$, and is transmitted from undersurface 10b side to upper surface 10c side of the substrate 10. The needle load $F_1$ applied in the normal direction to undersurface 10b is split into shear force in the direction parallel with inclined surface 10a and shear force in the direction vertical to inclined surface 10a by inclined surface 10a. Since gap d and a gap between the penetration hole of first substrate 10 and bolt 6 are formed, first substrate 10, while squeezing stress absorber 12, is displaced, although slightly upward along inclined surfaces 10a and 11a (shown by a broken line in FIG. 3). As a result, while stress absorber 12 receives shear force from inclined surfaces 10a and 11a in addition to compressive pressures, stress absorber 12 comprising the elastic member is deformed, thereby absorbing and dispersing these compressive pressures and shear force. That is, probe card 1 of the present embodiment absorbs force applied by overdrive action to bend first substrate 10 by stress absorber 12, and at the same time, releases the force laterally by the displacement of the substrate 10 along inclined surfaces 10a and 11a.

In this manner, probe card 1 of the present embodiment enhances the rigidity for the needle load by reinforcing plates 3a and 3b, thereby preventing first substrate 10 from being deformed and, at the same time, disperses and absorbs the needle load by means of inclined surface 10a of first substrate 10 and stress absorber 12, and therefore, bending of first substrate 10 by the needle load can be effectively prevented.

To obtain reliable electrical test results, it is important to decide an appropriate overdrive amount uniformly applied to each pad by the contact with all the probes. Since probe card 1 of the present embodiment can effectively prevent the bending of first substrate 10 by the needle load, all the probes can be uniformly pushed against each pad. As a result, the most appropriate overdrive amount can be easily determined, thereby enhancing the reliability of the electrical test result. Further, since probe card 1 of the present embodiment can make the contact area of fixing portion 2b and through-hole 9 wide, the contact resistance value is stabilized and, at the same time, the electroconductivity is improved, and thus, the reliability of the electrical test result is also enhanced.

While preferred embodiments of the present invention have been described using specific terms, such description is for illustrative purposes only, and it is to be understood that changes and variations may be made without departing from the spirit or scope of the following claims.

The invention claimed is:

1. A probe card comprising:
   a board having through-holes formed therein, into which probes are to be inserted, and probes extending from said through-holes are abutted on a measurement object so as to measure a variety of electrical properties of said measurement object; and
   an electroconductive elastic member,
   wherein said board extends along a plane,
   wherein said board comprises a first substrate having a first inclined end surface at an end thereof, and a second substrate having a second inclined end surface at an end thereof, said first inclined end surface and said second inclined end surface being inclined with respect to the plane, and
   wherein said first substrate and said second substrate are disposed adjacent one another such that said first inclined end surface and said second inclined end surface are opposed to each other, and said electroconductive elastic member is located between said first inclined end surface and said second inclined end surface.

2. The probe card according to claim 1, further comprising a fixing member for fixing together said first substrate and said second substrate, said fixing member being adapted to abut a first end surface and a second end surface of said second substrate, each of said second substrate first end surface and said second substrate second end surface extending parallel to the plane and adjoining the second inclined end surface, and to abut a first end surface of said first substrate to which said probe extends, said first substrate first end surface extending parallel to the plane and adjoining the first inclined end surface,
   wherein a gap is formed between said fixing member and a second end surface of said first substrate, said first substrate second end surface extending parallel, to the plane and adjoining the first inclined end surface.

3. The probe card according to claim 1,
   wherein said through-holes are located in the first substrate and have a diameter narrowing toward the first substrate second end surface, and
   wherein said through-holes have a tapered shape corresponding to a tapered shape of end portions of the probes, the tapered shape of the through-holes and the tapered shape of the end portions of the probes defining a common angle with respect to the plane.

4. The probe card according to claim 2,
wherein said through-holes are located in the first substrate and have a diameter narrowing toward the first substrate second end surface, and
wherein said through-holes have a tapered shape corresponding to a tapered shape of end portions of the probes, the tapered shape of the through-holes and the tapered shape of the end portions of the probes defining a common angle with respect to the plane.

5. The probe card according to claim 1, wherein said electroconductive elastic member is adapted to at least partially absorb a force applied to said first substrate.

6. The probe card according to claim 5, wherein the force applied to said first substrate is a mechanical force.

7. The probe card according to claim 1,
wherein said first substrate has an end surface extending parallel to the plane and adjoining the first inclined end surface,
wherein said second substrate has an end surface extending parallel to the plane and adjoining the second inclined end surface, and
wherein said first substrate and said second substrate are disposed such that said first substrate end surface is substantially level with said second substrate end surface.

8. A probe card comprising:
a first substrate having a ramped end surface at an end thereof the first substrate having through-holes for receiving a plurality of probes;
a second substrate having a ramped end surface at an end thereof; and
an electroconductive elastic member,
wherein said first substrate and said second substrate are disposed adjacent one another such that said first substrate ramped end surface and said second substrate ramped end surface face one another, and such that the electroconductive elastic member is located between said first substrate ramped end surface and said second substrate ramped end surface.

9. The probe card according. to claim 8, wherein said electroconductive elastic member is adapted to at least partially absorb a force applied to said first substrate.

10. The probe card according to claim 9. wherein the force applied to said first substrate is a mechanical force.

11. The probe card according to claim 8,
wherein said probe card extends along a plane,
wherein said first substrate has an end surface extending parallel to the plane and adjoining said first substrate ramped end surface,
wherein said second substrate has an end surface extending parallel to the plane and adjoining said second substrate ramped end surface, and
wherein said first substrate and said second substrate are disposed such that said first substrate end surface is substantially level with said second substrate end surface.

12. A probe card comprising:
a first substrate having a ramped end surface at an end thereof, said first substrate having through-holes for receiving a plurality of probes;
a second substrate having a ramped end surface at an end thereof; and
an elastic member located between said first substrate ramped end surface and said second substrate ramped end surface,
wherein said probe card extends along a plane, and
wherein said ramped end surface of said first substrate and said ramped end surface of said second substrate incline at said plane.

13. The probe card according to claim 12,
wherein said first substrate has a first main surface extending parallel to said plane and a second main surface extending parallel to said plane,
wherein said plurality of probes extend from said first main surface, and
wherein said first main surface is larger than said second main surface.

14. The probe card according to claim 13, further comprising:
a fixing member fixing together said first substrate and said second substrate.

15. The probe card according to claim 14,
wherein said second substrate has a first main surface extending parallel to said plane and a second main surface extending parallel to said plane, and
wherein said fixing member has a first portion adapted to abut said first main surface of said first substrate and said main surface of said second substrate, and a second portion adapted to abut said second main surface of said second substrate.

16. The probe card according to claim 15,
wherein said second portion of said fixing member has a gap to said second main surface of said first substrate.

17. The probe card according to claim 15,
wherein said second portion of said fixing member is extended onto said second main surface of said first substrate.

18. The probe card according to claim 12, wherein said elastic member is an electroconductive elastic member.

* * * * *